United States Patent
Nakajima et al.

(10) Patent No.: US 6,762,492 B2
(45) Date of Patent: Jul. 13, 2004

(54) SEMICONDUCTOR DEVICE, IMAGE SCANNING UNIT AND IMAGE FORMING APPARATUS

(75) Inventors: Mitsuru Nakajima, Tokyo (JP); Hiroshi Takemoto, Tokyo (JP)

(73) Assignee: Ricoh Company, Ltd., Tokyo (JP)

( * ) Notice: Subject to any disclaimer, the term of this patent is extended or adjusted under 35 U.S.C. 154(b) by 0 days.

(21) Appl. No.: 10/171,549

(22) Filed: Jun. 17, 2002

(65) Prior Publication Data

US 2003/0011056 A1 Jan. 16, 2003

(30) Foreign Application Priority Data

Jun. 15, 2001 (JP) ........................................ 2001-182262

(51) Int. Cl.[7] .............................................. H01L 23/34
(52) U.S. Cl. .................. 257/714; 257/715; 257/676; 257/678; 257/778; 438/113; 438/124; 438/127
(58) Field of Search ................................ 257/676, 678, 257/714, 715, 778, 706, 773, 790; 438/113, 124, 127; 250/208.1

(56) References Cited

U.S. PATENT DOCUMENTS 6,104,093 A * 8/2000 Caletka et al. .............. 257/778
6,214,644 B1 * 4/2001 Glenn ........................ 438/108
6,396,043 B1 * 5/2002 Glenn et al. ............. 250/208.1
6,416,256 B1 * 7/2002 Surjan et al. ............. 405/259.5

FOREIGN PATENT DOCUMENTS

JP         6-204442         7/1994

* cited by examiner

Primary Examiner—David Nelms
Assistant Examiner—Dao H. Nguyen
(74) Attorney, Agent, or Firm—Oblon, Spivak, McClelland, Maier & Neustadt, P.C.

(57) ABSTRACT

A semiconductor device is disclosed in which no protruding portion is required and an occurrence of parasitic capacitance is prevented. The semiconductor device includes a substrate 1 which has a wiring portion 5 and a semiconductor chip 2 which has a functional surface 2a in a front surface thereof and which is bonded by flip chip bonding onto said substrate through a holding member. The holding member which holds the semiconductor chip 2 and the substrate 1 is composed of an adhesive material 3 in one embodiment, and the adhesive material adheres the substrate 1 on at least one surface other than both of the front surface and an opposing surface thereof and it is arranged for the adhesive material not to enter a space between the substrate 1 and the semiconductor device 2.

8 Claims, 9 Drawing Sheets

SEMICONDUCTOR DEVICE, IMAGE SCANNING UNIT AND IMAGE FORMING APPARATUS

BACKGROUND OF THE INVENTION

1. Field of the Invention

The present invention relates to a semiconductor device in which a parasitic capacitance can be prevented, and to an image scanning unit utilizing the same and an image forming apparatus utilizing the same.

2. Description of the Prior Art

It is generally well known that an adhesive material (sealing material) is used in a space between a semiconductor chip and a substrate to reduce a physical stress by a thermal expansion on a circuit in order to prevent an electrical breakage at contacting point in an electrical circuit which is caused by a difference between the coefficient of thermal expansions of them when a semiconductor chip is bonded on a substrate by means of a face down bonding technology.

In the past when a semiconductor chip is utilized as an optical device, in order to prevent an occurrence of problem that an electrical performance of the device can not be carried out because the adhesive materials for the semiconductor chip happens to inundate to the accepting surface (or the light emitting surface) of the device and block off the light path, a method is employed in that a protruding portion is arranged for the adhesive material not to wraparound the accepting surface as disclosed in Japanese Laid Open Patent Hei 06-204442.

However in the above described method, there were problems that a manufacturing cost of the device was got higher to form the protruding portion, and the production process for it was made complicated because there was a need that the protruding portion had to be made at the entire circumference of the semiconductor chip and the need had to be satisfied in the process.

The above described wraparound problem is viewed with suspicion not only in the optical devices but also in a device for high frequency circuit. In the high frequency circuit, there may be a fear that the adhesive material becomes an invisible electrical circuit and it can not perform its desired function because it works as a capacitor with a harmful parasitic capacitance. It is very difficult to estimate the parasitic capacitance with preliminary survey especially when it is made in a large scale production, and it is impossible to make an amount of the wraparound constantly without fluctuation. In a recent movement of a realization of high speed driving of semiconductor, the problem of parasitic capacitance comes out to fore and it causes an unable problem to disregard in the whole business world of semiconductor mounting.

SUMMARY OF THE INVENTION

Because of these situation an object of the present invention is to provide a semiconductor device, an image scanning unit and an image forming apparatus in that there are no need to arrange the protruding portion and in that the parasitic capacitance is prevented.

To attain the above described object by the present invention a semiconductor device including: a substrate which has a wiring portion; and a semiconductor chip which has a functional surface in a front surface thereof and which is bonded by flip chip bonding onto the substrate; wherein an adhesive material which is used to adhere and fix the semiconductor chip and the substrate, adheres the substrate on at least one surface other than both of the front surface and an opposing surface thereof, and wherein the adhesive material does not enter into a space between the substrate and the semiconductor chip, is provided.

By this arrangement the adhesive material does not contact with a functional surface of the semiconductor chip and the above described problems are solved that the adhesive material becomes an invisible electrical circuit and it can not perform its desired function because it works as a capacitor with a harmful parasitic capacitance and that adhesive material block off the light path because it wraparound the light accepting surface (or the light emitting surface). At the same time the semiconductor chip can give the heat generated in the semiconductor chip away to environment because the adhesive material does not cover an opposite surface of the semiconductor functional surface.

In the semiconductor device according to the present invention the adhesive material is covered with adhesive material which has been cured. By this arrangement the adhesive material is prevented to flow out (prevention of flowing out) thereby the adhesive material would not enter between the functional surface of the semiconductor chip and the substrate because of flowing out of the adhesive material And at the same time a layout of the adhesive material becomes easier because an initial structure of the adhesive material is maintained.

In the semiconductor device according to the present invention a cross section of the adhesive material is a circular. By this arrangement in addition to the above described action for prevention of flowing out, the adhesive material has enough strength against internal and external pressure even before it is hardened. Also the production is easily performed.

In the semiconductor device according to the present invention a cross section of the adhesive material is a polygonal. By this arrangement in addition to the above described action for prevention of flowing out, the adhesive strength can be made higher because an adhering area between the adhesive material and the semiconductor chip and the substrate can be took wider.

In the semiconductor device according to the present invention the adhesive material is held by an adhesive material holding means. In this arrangement in addition to the above described actions that the adhesive material is prevented to contact with the functional surface of semiconductor chip and so on, the adhesive material would not wraparound between the functional surface of semiconductor chip and the substrate because the flowing out of adhesive material can be prevented effectively even when the adhesive material with low viscosity is utilized. According to this fact the adhesive material with low viscosity can be used as the adhesive material.

In the semiconductor device according to the present invention the adhesive material holding means is made of a sponge like material. By this arrangement the adhesive material in the supporting body can be operated with a negative pressure and by this negative pressure the adhesive material can be supported in the body.

In the semiconductor device according to the present invention the adhesive material holding means is made of an aggregated body of fibers. By this arrangement the adhesive material holding member can hold the adhesive material by means of the aggregated body of fibers.

In the semiconductor device according to the present invention the adhesive material holding means has a light transparent property. By this arrangement a photo curing type adhesive material can be used because whole surface of the held adhesive material is irradiated by a hardening light through the adhesive material supporting body.

In the semiconductor device according to the present invention the adhesive material adheres the substrate at entire circumference of surfaces other than both of the front surface and the opposing surface. By this arrangement in addition to the above described actions the problem would not occur that performance of the device can not be carried out because the adhesive material is not disposed on a light incident area and the light path of the incident light to (or outgoing light from) the semiconductor device would not block off by the adhesive material.

In the semiconductor device according to the present invention the adhesive material is a photo curing type adhesive material. By this arrangement the semiconductor chip and the substrate can be adhered to fix without any discrepancy of holding position due to thermal expansion because a rise in temperature would not almost occur when the adhesive material is cured by a light. Also it does never happen that a residual stress influenced by a temperature change in the adhering process.

In the semiconductor device according to the present invention the adhesive material is a heat curing type adhesive material having a curing temperature which is lower than a temperature that breaks a junction between the substrate and the semiconductor device. By this arrangement the adhesive material can be cured by a heat by means of utilizing a heat curing type adhesive material even where the portion can not be irradiated by a light. Because the curing temperature for the heat curing type adhesive material is selected at a predetermined temperature that is lower than a temperature that breaks the conjunction of electrode such as solder or golden bump and so on which electrically connects the semiconductor chip with the wiring portion of the substrate, the substrate and the semiconductor chip can be connected and fixed with maintaining a reliability of the electrical conjunction without occurrence of breakage of the conjunction.

In the semiconductor device according to the present invention the substrate is made of a light transparent material, the semiconductor chip has an optical functional surface and a space is formed between the optical functional surface and the light transparent substrate as a light incident space. By this arrangement in addition to the above described actions the problem would not occur that the performance of the device can not be carried out because the adhesive material is not disposed on a light incident area and the light path of the incident light to (or the outgoing light from) the semiconductor device would not block off by the adhesive material.

By the present invention a semiconductor device including: a substrate which has a wiring portion in a front surface thereof; and a semiconductor chip which has a functional surface and which is bonded by flip chip bonding onto the substrate; wherein an adhesive material which is used to adhere and fix the semiconductor chip and the substrate, adheres the substrate on at least one surface other than both of the front surface and an opposing surface thereof, the adhesive material does not enter into a space between the substrate and the semiconductor chip, and wherein a heat radiating means is disposed at the back surface of the semiconductor chip, is provided.

By this arrangement the adhesive material does not contact with a functional surface of the semiconductor chip and the above described problems are solved that the adhesive material becomes an invisible electrical circuit and it can not perform its desired function because it works as a capacitor with a harmful parasitic capacitance and that adhesive material block off the light path because it wraparound the light accepting surface (or the light emitting surface). At the same time the semiconductor chip can give the heat generated in the semiconductor chip away to environment and prevent a deformation of the semiconductor chip because the adhesive material does not cover an opposite surface of the semiconductor functional surface and the heat radiating means is disposed.

In the semiconductor device according to the present invention the heat radiating means is made of an elastic member which performs an elastic deformation according to a thermal deformation of the semiconductor chip along a direction of the functional surface of the semiconductor chip. By this arrangement the heat radiating means would not regulate against the expansion and the contraction by heat and thereby the expansion and the contraction of the heat radiating means does not effect on the semiconductor chip. By this arrangement the semiconductor chip and the substrate are made to be free from the thermal stress other than caused by themselves, and thereby they are free from deformation by an external force.

In the semiconductor device according to the present invention the elastic member is a wave like member which is formed in a wave like shape. By this arrangement the heat radiating means can have the elasticity along an expansion and a contraction direction of the semiconductor chip even when the heat radiating means are made of a hard material.

In the semiconductor device according to the present invention the elastic member is a spiral like member which is formed in a spiral shape. By this arrangement the heat radiating means can have the elasticity along an expansion and a contraction direction of the semiconductor chip even when the heat radiating means are made of a hard material.

In the semiconductor device according to the present invention the heat radiating means is a wire like member which is formed in a wire like shape. By this arrangement to the expansion or the contraction of the semiconductor chip which is caused by heat the heat radiating means would not regulate to the expansion and the contraction along the direction of the expansion and the contraction because the heat radiating means is made to have a smaller contacting area space contacting with the semiconductor device. And at the same time he heat radiating means would not give an influence the stress to the semiconductor chip caused by a deformation of itself.

In the semiconductor device according to the present invention the heat radiating means is a spike like member which is formed in a spike like shape. By this arrangement to the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device. And at the same time he heat radiating means would not give an influence the stress to the semiconductor chip caused by a deformation of itself.

In the semiconductor device according to the present invention the heat radiating means is a spherical member which is formed in a spherical shape. By this arrangement to the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device. And at the same time he heat radiating means would not give an influence the stress to the semiconductor chip caused by a deformation of itself.

In the semiconductor device according to the present invention the semiconductor chip is a solid state image forming device. By this arrangement in addition to the above described actions the problem would not occur that performance of the device can not be carried out because the adhesive material is not disposed on a light incident area and the light path of the incident light to (or outgoing light from) the semiconductor device would not block off by the adhesive material.

The present invention is characterized by an image scanning unit including the above described semiconductor device. By this arrangement because the incident light to the solid state image forming device is not blocked off and the performance of solid state image forming device can be carried out sufficiently, there is no possibility of occurrence of error in reading the image data and thereby the image scanning unit with high reliability can be provided.

Also the present invention is characterized by an image forming apparatus including the above described image forming unit. By this arrangement because the performance of solid state image forming device can be carried out sufficiently, there is no possibility of occurrence of error in reading the image data and because the image forming apparatus includes the image forming unit which can carry out the image forming with high reliability, the apparatus can form electrostatic latent image with high accuracy thereby there is no possibility of occurrence of error in reading the image of the manuscript.

DETAILED DESCRIPTION OF THE PREFERRED EMBODIMENTS

Figure 1:
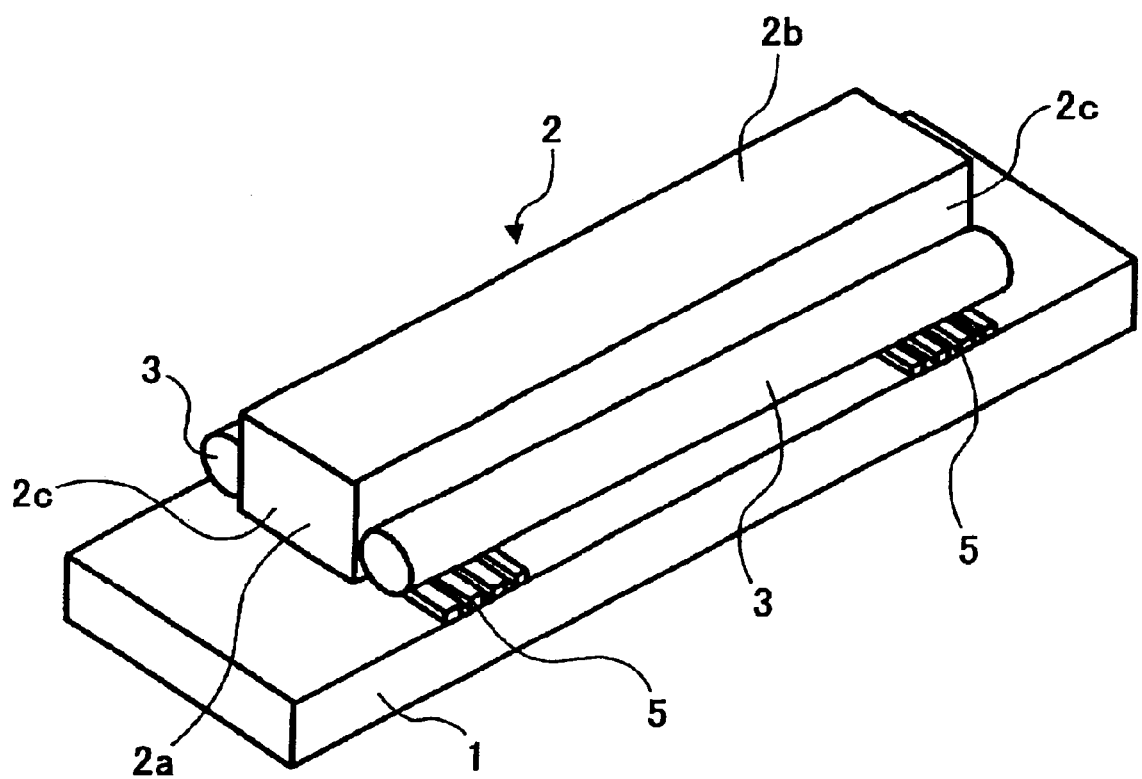
FIG. 1 is a perspective view to show an entire structure of the semiconductor device according to an embodiment 1 of the present invention.
Figure 2A:
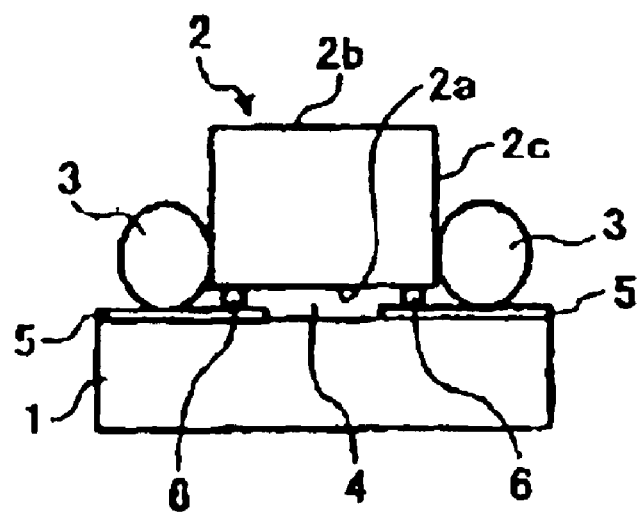
FIG. 2A is a cross sectional view along a direction perpendicular to a longer direction of the semiconductor device shown in FIGS. 1 and 2B is a cross sectional view of the semiconductor device shown in FIG. 1 showing an adhesive material held by a holding member.

In a semiconductor device according to an embodiment 1 of the present invention, as shown in FIG. 1 and FIG. 2A, a semiconductor chip 2 and a substrate 1 are adhered together with a cylindrical adhesive material 3 at surfaces other than a functional surface 2a of the semiconductor chip and an opposite surface 2b of the functional surface 2a, that is to say at the side surfaces 2c. At this point a space 4 is made between the substrate 1 and the semiconductor chip 2, and the space 4 is made also as a space which does not contain the adhesive material 3.

The above described cylindrical adhesive material 3 is cured only at its surface portion and covered with the cured portion and the covered surface is broken only at portions which contact with the surfaces to be adhered, and an uncured adhesive material inside is exposed to be adhered with the surface to be adhered, thereby a surface of the substrate 1 and the side surfaces 2c of semiconductor chip 2 are adhered together. A curing of the surface portion of adhesive material 3 is performed, for example, by a heating at surface portion to cure only at the surface portion when a heat curing type adhesive material is used, or by a ultra violet irradiation in short time to cure only at the surface portion when an ultra violet curing type adhesive material is used. And after the adhesive material is disposed in a predetermined adhering position, the entire surfaces to be adhered are broken to be adhered by giving pressure, heating up, a laser irradiation and so on.

A length of the above described cylindrical adhesive material 3 along a longer direction is adjusted in the length which is almost equal to that of the semiconductor chip 2 in this embodiment as shown in FIG. 1.

The above described adhesive material 3 is made to have enough strength against an internal and an external pressure because the outer shape of it is cylindrical, that is to say, it has circular cross section. Or in another case when the adhesive material 3 is made to have a shape with polygonal pillar, that is to say it has a polygonal cross section, it shows an advantage in the adhering process because area of the surface to be adhered can be expanded.

In the case when the adhesive material has a polygonal pillar shape, it is preferable that an angle which is made between the two surfaces to be the surfaces to be adhered, is made to be almost the same as the angle which is made between the surface of substrate 1 and the side surface 2c of the semiconductor chip 2. When the angle which is made between the two surfaces to be adhered, is almost the same as an angle which is made between the surface of substrate 1 and the side surface 2c of the semiconductor chip 2, it may have a shape that a part of the cylindrical pillar is cut away.

Figure 2B:
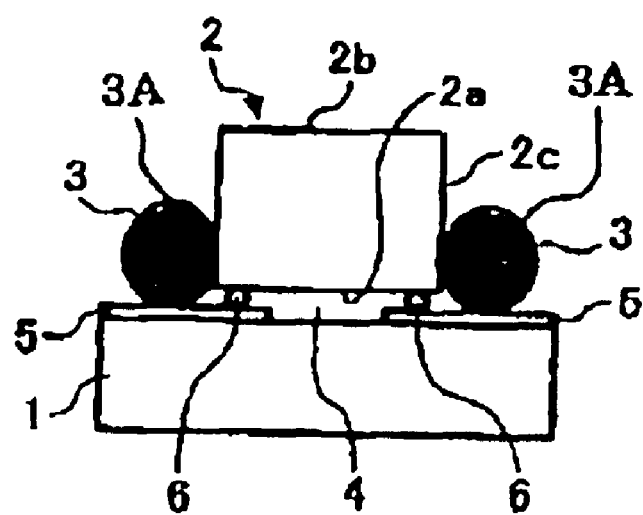

As shown in FIG. 2B, the same structure can be employable in a case when the adhesive material 3 is held by an adhesive material holding member 3A as an adhesive material supporting body in FIG. 2B instead of curing its surface. Because the adhesive material 3 is held by the adhesive material holding member 3A, the adhesive material 3 is prevented to flow out and thereby the adhesive material 3 would not enter into a space between the substrate 1 and the functional surface 2a of the semiconductor chip.

For the adhesive material holding member 3A, for example, a material like a sponge can be employable. In such case because the adhesive material 3 is the material like a sponge, the adhesive material in the supporting body can be operated with a negative pressure to support the adhesive material in the body. And also aggregated body of fiber and so on can be employable as the adhesive material holding member 3A. That is to say, it is sufficient for the adhesive material holding member 3A to have a holding force to keep the adhesive material 3 not to flow out. And also when the adhesive material holding member 3A is made to have a light transparent property, the adhesive material of a photo curing type can be employable because a light can be irradiated to the adhesive material 3 through the adhesive material holding member 3A.

According to the above described embodiment 1 of the present invention in the semiconductor device in which a semiconductor chip 2 is adhered onto the substrate 1 with the wiring portion 5 by the flip chip bonding method, because the semiconductor chip 2 and the substrate 1 are adhered together with the adhesive material 3 on at least one surface other than the front surface 2a of the semiconductor chip and the opposite surface 2b, that is to say at the side surfaces 2c, and at the same time the adhesive material does not enter into the space between the substrate 1 and the semiconductor chip 2, the adhesive material 3 is prevented to contact with the functional surface 2a of semiconductor chip, thereby it is prevented that the adhesive material becomes an invisible electrical circuit and it can not perform its desired function because it works as a capacitor with a harmful parasitic capacitance. Also the adhesive material would not flow into the space between the substrate and the semiconductor chip because the surface of adhesive material 3 is covered with the cured adhesive material or the adhesive material supporting body is arranged. According to this embodiment, the manufacturing process can be prevented to become complicated and the production cost can be maintained in low because the protruding portion need not to be formed.

Embodiment 2

Figure 3:
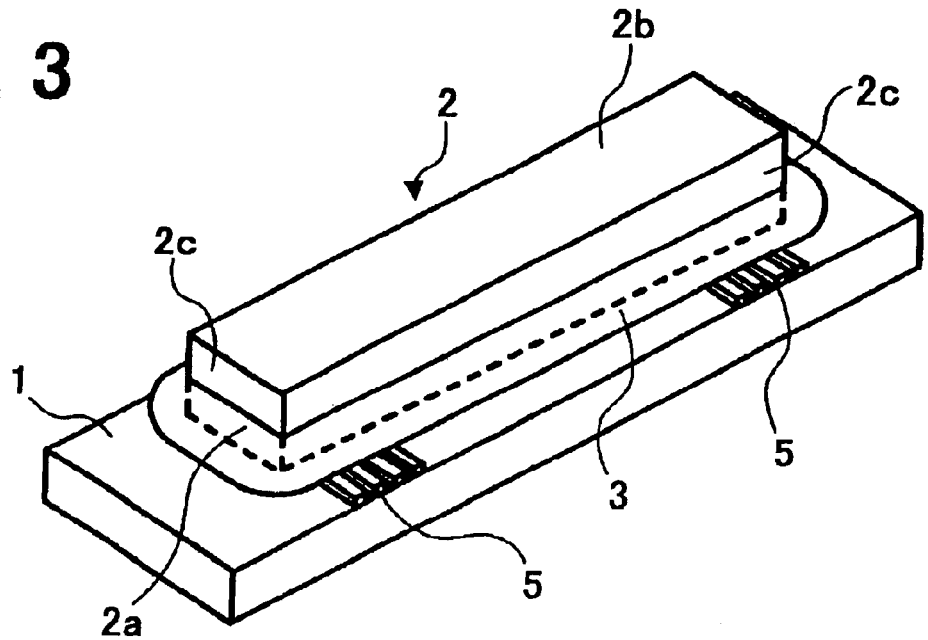
FIG. 3 is a perspective view to show an entire structure of the semiconductor device according to an embodiment 2 of the present invention.

FIG. 3 is a perspective view to show an entire structure of the semiconductor device according to an embodiment 2 of the present invention. The semiconductor chip 2 and the substrate 1 are adhered with the adhesive material 3 at surfaces other than the functional surface of the semiconductor chip and an opposite surface of the functional surface 2a, that is to say at a side surfaces 2c as shown in FIG. 3.

In accordance with the embodiment 2 of the present invention, the functional surface 2a of semiconductor chip can be cut off (sealed out) from an environment and thereby the functional surface 2a of semiconductor can be protected.

Figure 4:
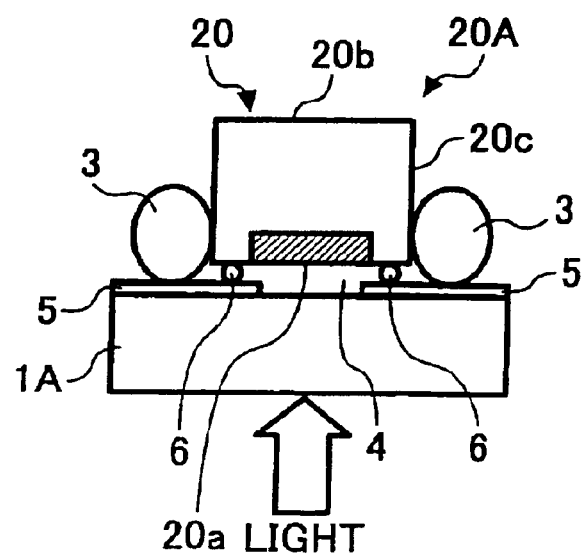
FIG. 4 is a cross sectional view which is corresponding to the cross sectional view of FIG. 2A when the semiconductor device shown in FIG. 1 and FIGS. 2A and 2B are utilized in a solid state image forming apparatus as an optical functional component.

The solid state image forming apparatus as a semiconductor device is made to include a light transparent substrate 1A such as glass, plastic and so on as the substrate 1, and a solid state image forming device 20 in the semiconductor device shown in FIG. 1 and FIGS. 2A and 2B as shown in FIG. 4, and other composition is quite the same as the device shown in FIG. 1 and FIGS. 2A and 2B. The solid state image forming device 20 includes an optical functional surface 20a which is corresponding to the functional surface 2a of semiconductor device 2.

In the solid state image forming device, a semiconductor chip 2 and a substrate 1A are adhered with the cylindrical shaped adhesive material at surfaces other than a functional surface 20a as a front surface and an opposite surface 20b of the functional surface 20a, that is to say at a side surfaces 20c. At this point the functional surface 20a is not covered with the adhesive material 3.

In accordance with any one of the embodiment shown in FIG. 1 to FIG. 4, because the substrate 1 (1A) is adhered with at least one of side surfaces 2c (20c) other than the front surface 2a (optical functional surface 20a) and the opposite surface 2b (20b), the stress caused by an expansion or a contraction of the semiconductor chip 2 (solid state image forming device 20) and substrate 1 (1A) in temperature change is made not to concentrate in a specific portion and the stress is scattered and loaded to the whole device thereby a local breakage of the semiconductor device 2 (solid state image forming device 20) and the substrate 1 (1A) can be prevented.

At the same time the adhesive material 3 is made not to contact with the functional surface 2a (optical functional surface 20a) of the semiconductor, thereby the problem that the adhesive material becomes an invisible electrical circuit and the semiconductor device can not perform its desired function because it works as a capacitor with a harmful parasitic capacitance, or the problem that the adhesive materials happens to inundate to the accepting surface (or the light emitting surface) of the device and block off the light path when the semiconductor chip is utilized as the optical device, are solved.

In accordance with any one of the embodiment shown in FIG. 1 to FIG. 4, the adhesive material 3 is made not to flow out and to enter the space between the substrate 1 (1A) and the functional surface 2a (optical functional surface 20a) of semiconductor because the adhesive material 3 is covered with the cured adhesive material 3 in the surface portion.

Further in accordance with any one of the embodiments shown in FIG. 1 to FIG. 4, the adhesive material 3 is made to have enough strength against internal and external pressure even before it is cured because it has a circular cross section. And at the same time the manufacturing of it is achieved easily.

Also in accordance with the embodiment shown in FIG. 4, the problem that the adhesive material 3 blocks off the incident light coming from (or the outgoing light to) the light path, and thereby the optical performance of the device can not be carried out because the optical functional surface 20a is not covered by the adhesive material when the substrate 1 is made by a material with the light transparent property and the semiconductor device 2 is the optical functional device.

Embodiment 3

Figure 5:
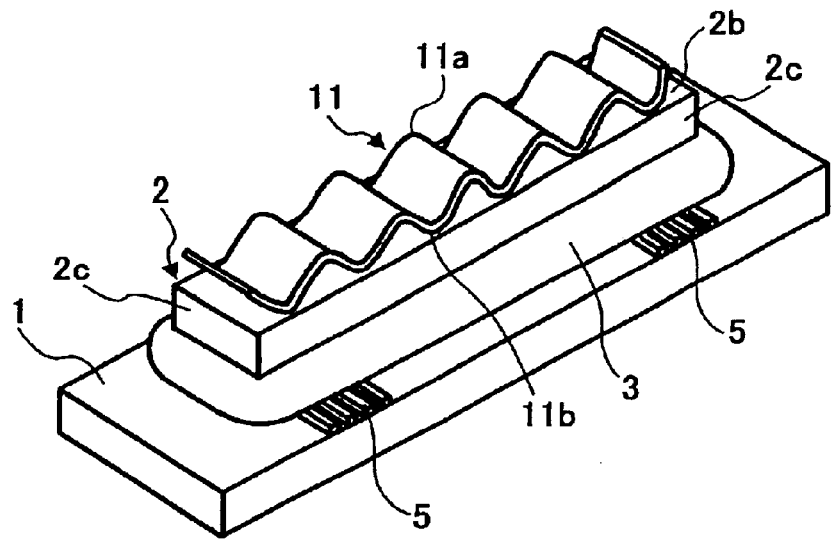
FIG. 5 is a perspective view to show an entire structure of the semiconductor device according to an embodiment 3 of the present invention.

FIG. 5 is a perspective view to show an entire structure of the semiconductor device according to an embodiment 3 of the present invention.

As shown in FIG. 5 the semiconductor device according to this embodiment 3 is made to he a same device other than including a heat radiating means 11 and other structure is quite the same as the device according to the embodiment 2 shown in FIG. 3 when they are compared.

The heat radiating means 11 is made to be in a wave like shape in succession of a top 11a and a bottom 11b and it is adhered onto the back surface 2b of semiconductor chip 2 by an adhesive material and so on. The heat radiating means 11 has an elastic property for an expansion and a contraction along the longer direction of the semiconductor dc 2 by heat because the wave like heat radiating means 11 is arraigned along a longer direction of the semiconductor chip 2 as described above. By this arrangement when an expansion or a contraction of the semiconductor chip 2 is caused by heat, the heat radiating means 11 would not be obstructive to the expansion and the contraction. And at the same time the expansion and the contraction of the heat radiating means 11 would not influence on the semiconductor chip 2. By this arrangement the semiconductor chip 2 and the substrate 1 are made to be free from the thermal stress other than caused by themselves, and thereby they are free from deformation by an external force.

Figure 6:
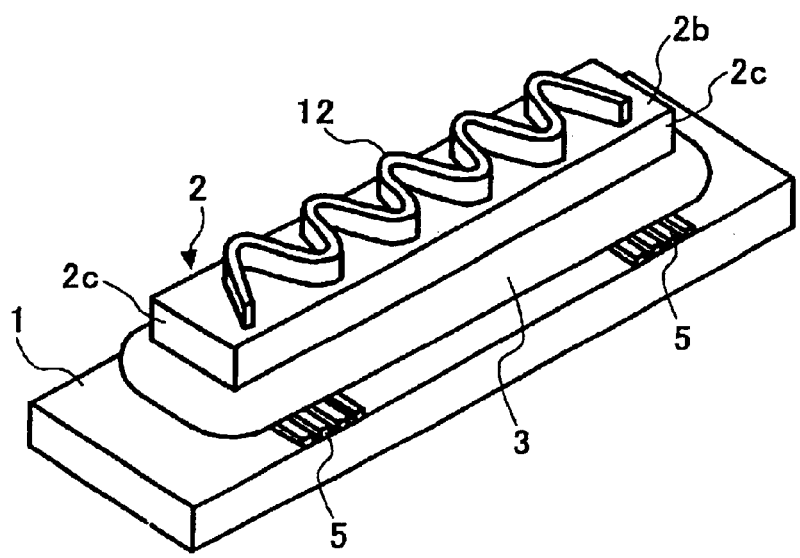
FIG. 6 is a perspective view to show a modified example of a heat radiating means for the semiconductor device illustrated in FIG. 5.

As shown in FIG. 6 this semiconductor device is made to be a same device other than shape of the beat radiating means from that of the embodiment 3 and other structure is quite the same as the device according to the embodiment 3 shown in FIG. 5.

The heat radiating means 12 of this embodiment is arranged in different direction from the heat radiating means 11 in FIG. 5. As described above though the semiconductor chip 2 expands and contracts in its longer direction with influence of the heat, because the heat radiating means 12 is made to have an elasticity, it has the same action and effect as the heat radiating means 11 shown in FIG. 6.

Figure 7:
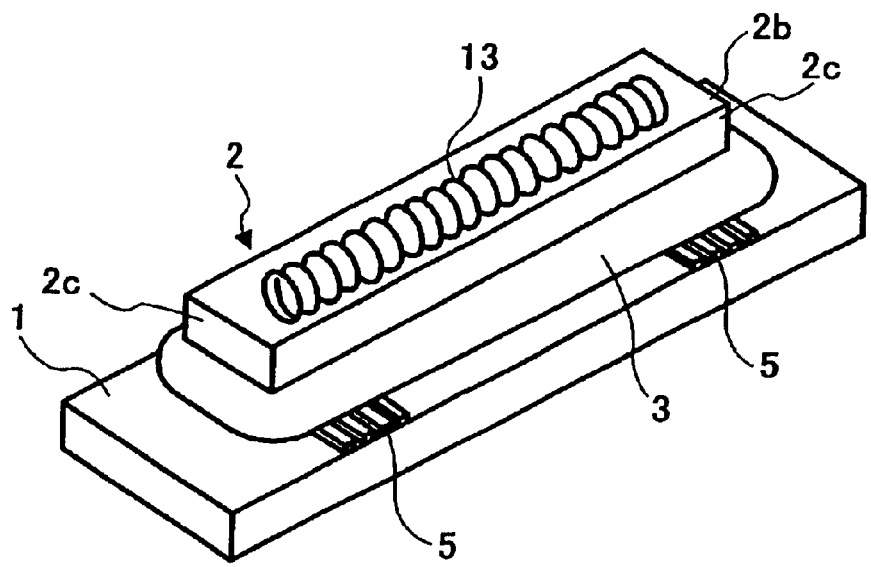
FIG. 7 is a perspective view to show another modified example of a heat radiating means for the semiconductor device illustrated in FIG. 5.

As shown in FIG. 7 this semiconductor device is made to be a same device other than shape of the heat radiating means from that of the embodiment 3 and other structure is quite the same as the device according to the embodiment 3 shown in FIG. 5.

The heat radiating means 13 is formed to be in a spiral shape and attached with a central axis of the spiral being aligned along the longer direction of the semiconductor chip. As described above though the semiconductor chip 2 expands and contracts in its longer direction with influence of the heat, because the heat radiating means 13 is made to have an elasticity, it has the same action and effect as the heat radiating means 11 shown in FIG. 5.

In accordance with any one of the embodiment shown in FIG. 5 to FIG. 7, because the heat radiating means 11–13 are made to be the members that have the elasticity for the deformation along the surface direction, the heat radiating means 11–13 would not be obstructive to the expansion and the contraction against the expansion or the contraction of the semiconductor chip 2 caused by the heat And at the same time the expansion and the contraction of the heat radiating means 11–13 would not influence on the semiconductor chip 2. By this arrangement the semiconductor chip 2 and the substrate 1 are made to be free from the thermal stress other than caused by themselves, and thereby they are free from deformation by an external force.

In accordance with any one of the embodiments shown in FIG. 5 to FIG. 7, the heat radiating means can have the elasticity along an expansion and a contraction direction of the semiconductor chip 2 even when the heat radiating means 11–13 are made of a hard material because the heat radiating means 11, 12 are made to be members of the wave like shape and the heat radiating means 13 is made to be member in the spiral shape.

Figure 8:
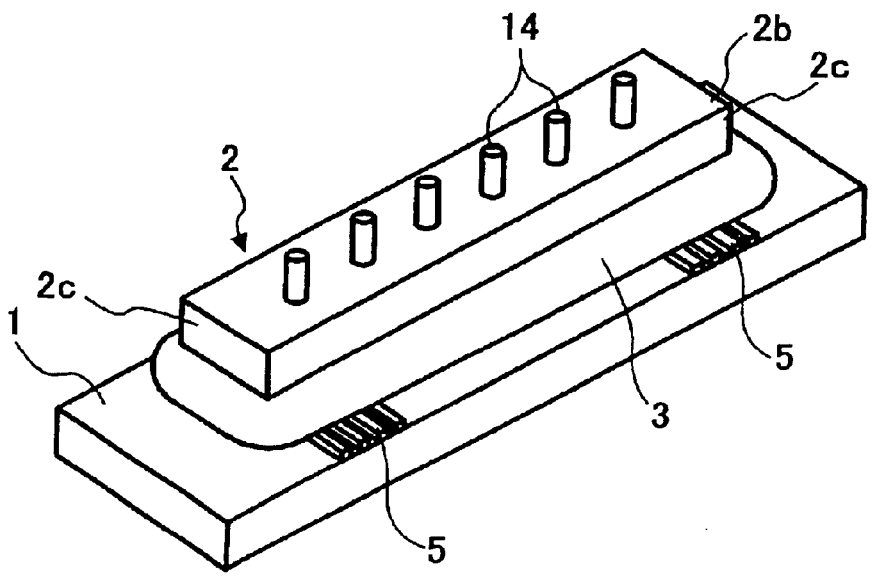
FIG. 8 is a diagram to show the other modified example of a heat radiating means for the semiconductor device illustrated in FIG. 5.

As shown in FIG. 8 this semiconductor device is made to be a same device other than shape of the heat radiating means from that of the embodiment 3 and other structure is quite the same as the device according to the embodiment 3 shown in FIG. 5.

The heat radiating means 14 of this embodiment is made to be in a line shape by a wire bonding apparatus which utilizes a thermo compression bonding method, an ultrasonic bonding in the prior art technology with cutting the wires in a halfway of the process. As described above though the semiconductor chip 2 largely expands and contracts in its longer direction with influence of the heat, because the heat radiating means 14 is made to have a smaller area space contacting with the semiconductor device 2 in the direction, when an expansion or a contraction of the semiconductor chip 2 is caused by heat, the heat radiating means 14 would not be obstructive to the expansion and the contraction. And at the same time the expansion and the contraction of the heat radiating means 14 would not influence on the semiconductor chip 2. By this arrangement the semiconductor chip 2 and the substrate 1 are made to be free from the thermal stress other than caused by themselves, and thereby they are free from deformation by an external force.

Figure 9:
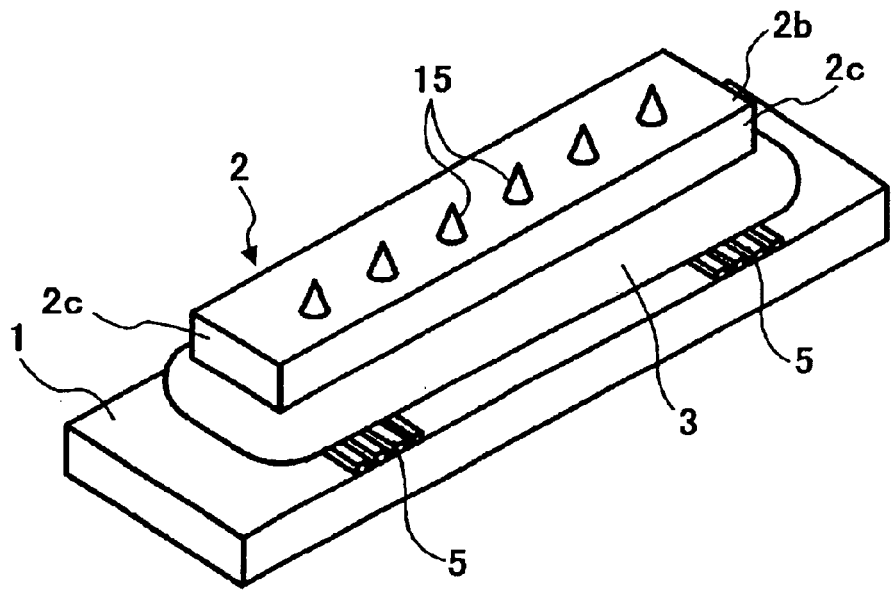
FIG. 9 is a perspective view to show still other modified example of a heat radiating means for the semiconductor device illustrated in FIG. 5.

As shown in FIG. 9 this semiconductor device is made to be a same device other than shape of the heat radiating means from that of the embodiment 3 and other structure is quite the same as the device according to the embodiment 3 shown in FIG. 5. The heat radiating means 14 of this embodiment is made to be in a spike shape by a wire bonding apparatus which utilizes a thermo compression bonding method, an ultrasonic bonding in the prior art technology with cutting the wires in a halfway of the process. As shown in FIG. 9 even the heat radiating means in shape of a spike which is made when a solder is wire bonded, has the heat radiation effect.

As described above though the semiconductor chip 2 largely expands and contracts in its longer direction with influence of the heat, because the heat radiating means 15 is made to have a smaller area space contacting with the semiconductor device 2 in the direction, it has the same action and effect as the heat radiating means 11 shown in FIG. 8.

That is to say in accordance with the embodiment shown in FIG. 9 when an expansion or a contraction of the semiconductor chip 2 is caused by heat, the heat radiating means 15 would not be obstructive to the expansion and the contraction because the heat radiating means 15 is made to be a member in spike like shape and to have a smaller contacting area space contracting with the semiconductor device 2 in the direction. And at the same time he heat radiating means 15 would not give an influence the stress to the semiconductor chip 2 caused by a deformation of itself.

Figure 10:
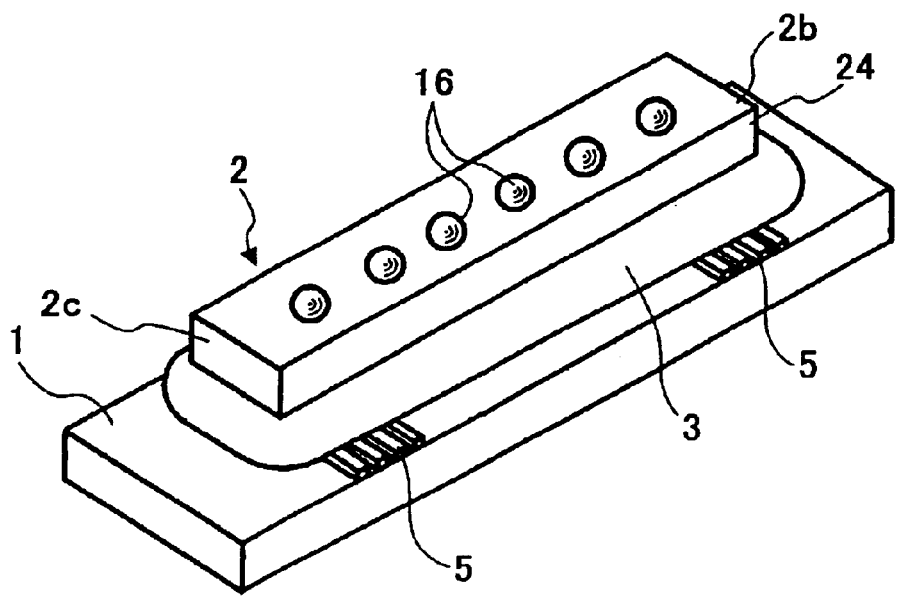
FIG. 10 is a perspective view to show still other modified example of a heat radiating means for the semiconductor device illustrated in FIG. 5.

As shown in FIG. 10 this semiconductor device is made to be a same device other than shape of the heat radiating means from that of the embodiment 3 and other structure is quite the same as the device according to the embodiment 3 shown in FIG. 5.

The heat radiating means 16 is made to be in a spherical shape. As shown in FIG. 10 even the heat radiating means in a spherical shape which is made when a solder is melted to become spherical and put on the semiconductor chip 2 to adhere, has the heat radiation effect.

As described above though the semiconductor chip 2 largely expands and contracts in its longer direction with influence of the heat, because the heat radiating means 16 is made to have a smaller area space contacting with the semiconductor device 2 in the direction, it has the same action and effect as the heat radiating means 11 shown in FIG. 8.

That is to say in accordance with the embodiment shown in FIG. 10 when an expansion or a contraction of the semiconductor chip 2 is caused by heat, the heat radiating means 16 would not be obstructive to the expansion and the contraction because the beat radiating means 16 is made to be a member in spherical shape and to have a smaller contacting area space contracting with the semiconductor device 2 in the direction. And at the same time he heat radiating means 15 would not give an influence the stress to the semiconductor chip 2 caused by a deformation of itself.

Figure 11:
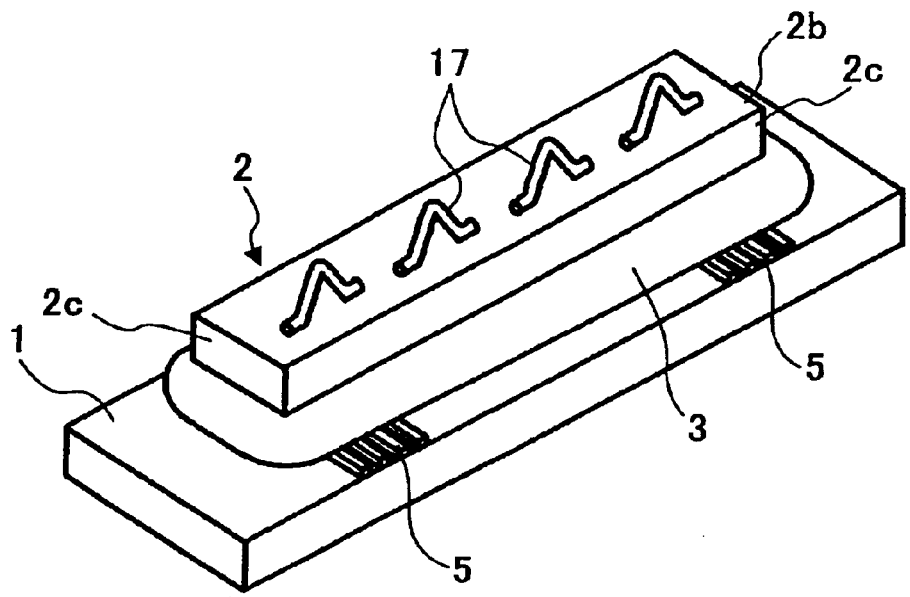
FIG. 11 is a perspective view to show still other modified example of a heat radiating means for the semiconductor device illustrated in FIG. 5.

As shown in FIG. 11 the heat radiating means 17 of this semiconductor device is another example of the heat radiating means in a line shape shown in FIG. 8. When it is difficult to make the heat radiating means 14 stand straight by the wire bonding apparatus as shown in FIG. 8, it may be arranged that a plurality of wires arc put on the semiconductor chip to be contact bonded at two points of the each wire as shown in FIG. 11. The heat radiating means 17 is formed in, for example, a line shape with inverted V. The heat radiating means 17 has also the same action and effect as the heat radiating means 14 shown in FIG. 8.

Figure 12:
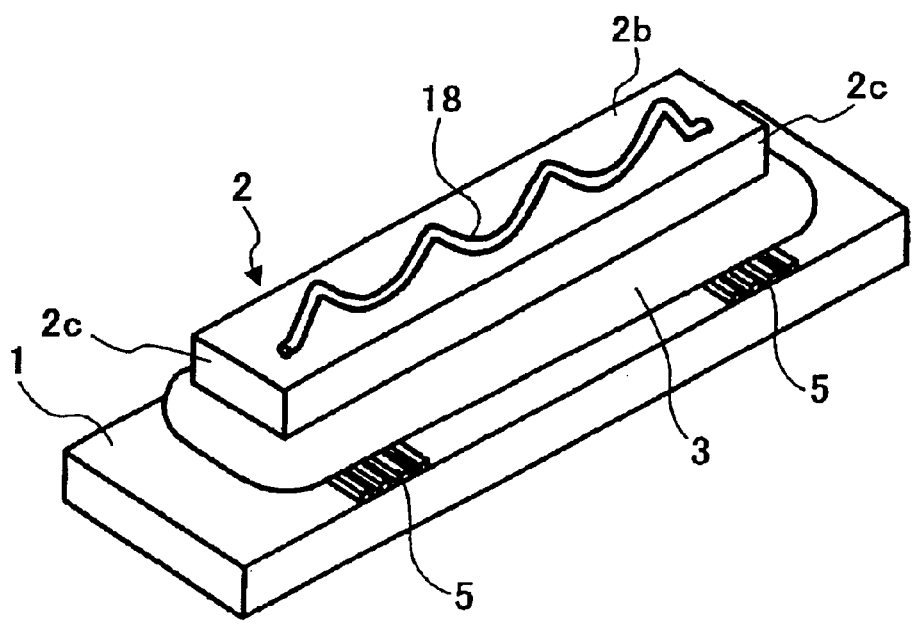
FIG. 12 is a perspective view to show still other modified example of a heat radiating means for the semiconductor device illustrated in FIG. 5.

As shown in FIG. 12 this semiconductor device 18 is other example of the heat radiating means in a line shape shown in FIG. 8. When it is difficult to make the heat radiating means 14 stand straight by the wire bonding apparatus as shown in FIG. 8, it may be arranged that a bent wire is put on the semiconductor chip to be contact bonded at a plurality of points of the wire as shown in FIG. 12. For the heat radiating means 18, for example, a plurality of inverted V shape lines are continuously formed with bending in this embodiment. The heat radiating means 18 also has the same action and effect as the heat radiating means 17 shown in FIG. 11.

The heat radiating means 11–18 shown in FIG. 5 to FIG. 11 are preferably made of a material with high thermal conductivity such as metal and it may be bonded by an adhesion or a contact bonding. Especially for the heat radiating means 14, 15, 17 and 18 as shown in FIGS. 8, 9, 11 and 12, it may be bonded by means of the wire bonding apparatus in the prior art technology and in such cases the heat radiating means is preferably made in the shape shown in the FIGS. 8, 9, 11 and 12.

In accordance with any one of the embodiment shown in FIGS. 8, 11 and 12, because the heat radiating means 14, 17 and 18 are made to be the members in a form of line and the heat radiating means 14, 17 and 18 have small contacting area surface with the semiconductor chip, thereby the heat radiating means 11–13 would not be obstructive to the expansion and the contraction against the expansion or the contraction of the semiconductor chip 2 caused by the heat. And at the same time he heat radiating means would not give an influence of the stress to the semiconductor chip 2 caused by a deformation of itself.

At this point the heat radiating means 11–19 shown in FIG. 5 to FIG. 12 can also be applicable to arrange on the semiconductor of the embodiment 1 of the present invention shown in FIG. 1.

Further any one of the heat radiating means 11–18 shown in FIG. 5 to FIG. 12 can also be applicable to arrange at the back side 20b of solid state image forming device 20 in the solid state image forming apparatus as for the semiconductor device shown in FIG. 4.

The semiconductor device shown in FIG. 5 to FIG. 12 can be replaceable with the solid state image forming device shown in FIG. 4. In this case it is necessary that a light transparent substrate is used and the optical functional surface 20a of solid state image forming device is covered with the adhesive material or optical functional surface 20a of solid state image forming device is not covered by the adhesive material at all. For example, when the semiconductor device shown in FIG. 5 to FIG. 12 are made to be the solid state image forming device, the optical functional surface 20a not have to be covered by the adhesive material.

The above described adhesive material 3 may be the photo curing type adhesive material or the heat curing type adhesive material the curing temperature of heat curing type adhesive material must be lower than a temperature which breaks a junction between the substrate 1 and the semiconductor device 2.

When the heat curing type adhesive material is used as the adhesive material 3, the process for curing the adhesive material can be performed in a dark room. Because the curing temperature for the heat curing type adhesive material is selected at a predetermined temperature that is lower than a temperature that breaks the conjunction of the electrode 6 such as solder or golden bump and so on which electrically connects the semiconductor chip 2 with the wiring portion 5 of the substrate 1, the substrate 1 and the semiconductor chip 2 can be connected and fixed with maintaining a reliability of the electrical conjunction without occurrence of breakage of the conjunction.

Further when the photo curing type adhesive material is used as the adhesive material 3, semiconductor chip 2 and the substrate 1 can be adhered to fix without any discrepancy of holding position due to thermal expansion because a rise in temperature would not almost occur when the adhesive material is cured by a light. Also it does never happen a residual stress influenced by a temperature change in the adhering process.

Though in the above described embodiment the semiconductor chip with elongated shape such as the line CCD, is only mentioned, however, the present invention is intended to include not only the elongated shape but such as a square, a polygonal, a circular and so on of all the shapes of semiconductor chip.

Figure 13:
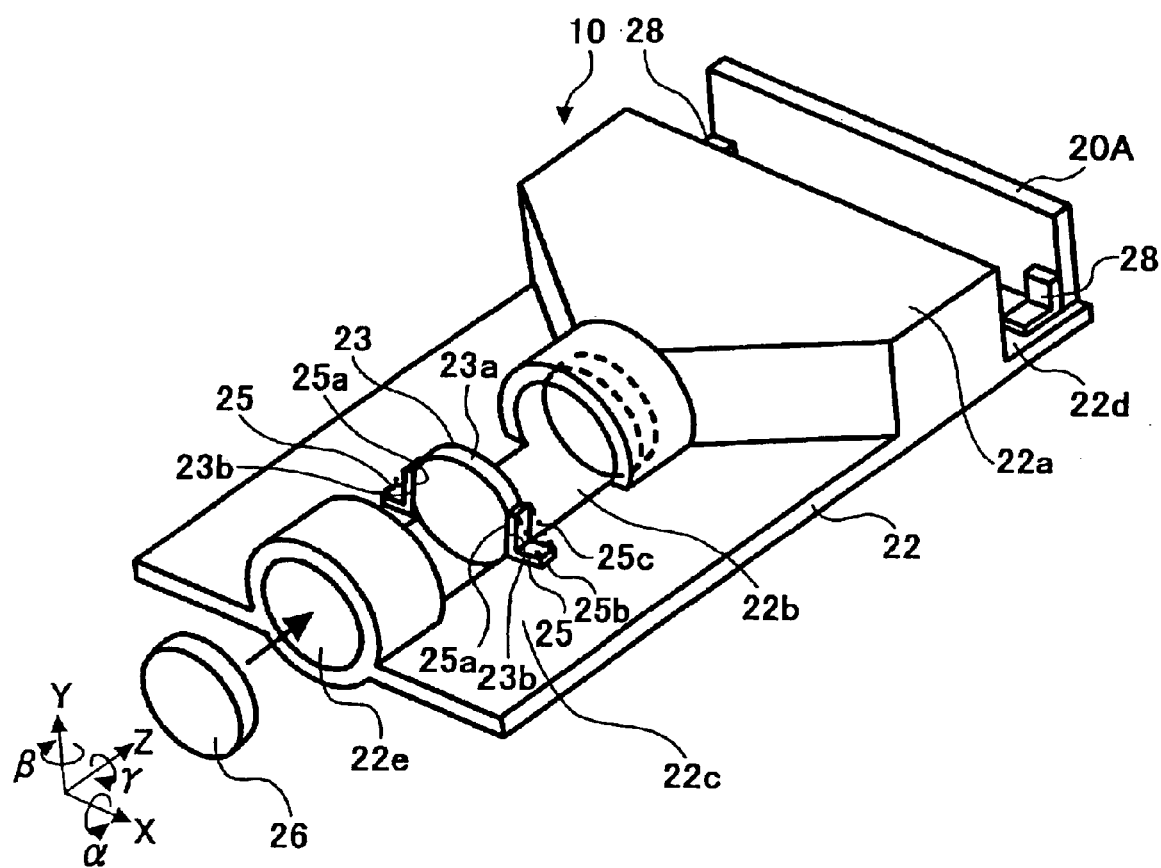
FIG. 13 is a perspective view to show an image scanning unit utilizing a solid state image forming device composed of the semiconductor device according to the present invention.

As shown in FIG. 13 the image scanning unit 10 utilizing the above described solid state image forming device includes: a lens 23 as an optical element having an edge surface 23a as an side edge of the lens around a light passing surface including a light axis along which light as an image forming light from a manuscript surface of a material to be copied; an intermediate holding member 25 having a first attaching surface 25a which is opposed to the edge surface 23a and a second attaching surface which is arranged to have a different angle from the first attaching surface, in this embodiment an angle perpendicular to the first attaching surface, and connecting between the lens 23 and a housing 22; and the housing 22 as a base member having a attaching surface 22c which is opposed to the second attaching surface. In the image scanning unit 10 the housing 22 and the lens 23 which is arranged to have adjusted in positional condition relative to the housing 22 are adhered and fixed through the intermediated holding member 25.

The above described lens 23 includes two flat surfaces 23b which are arranged in the same diameter on the edge surface 23a. The flat surfaces 23b are made by a cutting process or a grinding process and so on and rubbed when it is required. By making the flat surface 23b as described above, a surface area to be adhered with the first attaching surface 25a of intermediate holding member 25 can be expanded and thereby a strength of fixing can be enhanced.

The above described housing 22 is arranged to fix the lens 23 and solid state image forming device 20A in a adjusted position after they are adjusted relatively in a predetermined positional condition. The housing 22 includes: circular groove portion 22b; flat attaching surface 22c which is adjacent to the circular groove portion 22b; an attaching surface 22d onto which the solid state image forming device is attached; an image forming lens unit which is composed of the lens 23 and 26; and a light shielding cover 22a which makes light shielding between the image forming lens unit and the solid state image forming device 20A. By including the light shielding cover 22a, an influence of disturbance from the outside light can be prevented and clear image can be obtained. The housing 22 is fixed at a predetermined position onto an image scanning apparatus which will be described later by fixing means of screwing, caulking, adhering, welding and so on. The above described intermediate holding member 25 is made of a material with high light (ultraviolet) transmittance, for example ARTON (Trade name by JSR Corp.), Zeonex (Trade name by Zeon Corp.), polycarbonate and so on.

When the position of the lens is moved for positional adjustment of the lens, the above described intermediate holding member 25 slidably moves at the both adhering surface by a surface tension of the adhesive material and follows the movement of lens 23.

By the arrangement that the first attaching surface 25a and the second attaching surface 25b of the above described intermediate holding member 25, that is to say the both attaching surfaces, are arranged to cross at right angle, the positional adjustment of lens 23 becomes possible in a six axes and along respective adjustment axes the adjustment can be independently performed.

By the arrangement in that the two flat surfaces 23b at edge surface 23a of the lens 23 as the adhering surfaces in the optical element are opposed together utilizing the two intermediate holding member 25, an influence of shrinkage when the adhesive material is cured can be reduced.

By the arrangement in that a light transparent rib 25e is disposed between the both adhering surfaces of the intermediate holding member 25 as shown in FIG. 13, a strength of the intermediate holding member 25 can be increased without increasing a loss of light when the photo curing type adhesive material is cured.

Because the first attaching surface 25a which is the adhering surface for the lens 25 of the above described intermediate holding member 25 and the second attaching surface 25b which is the adhering surface for the intermediate holding member, are arranged to cross in the right angle, the positional adjustment can be independently performed in respective X, Y, Z, $\alpha$, $\beta$ and $\gamma$ adjusting directions of the lens.

When thinking about a case in which the intermediate holding member 25 is connected and fixed with the lens 23 and the housing 22 by means of the photo curing type adhesive material, the lens 23 and the intermediate holding member 25 have the positional adjustment with a sliding movement on a housing attaching surface 22c as a fixing surface for holding member side of the housing 22 when they are adjusted along the X and Z direction.

And when they are adjusted along the Y direction, the moving lens 23 has the positional adjustment with a sliding movement on the first attaching surface 25a as a fixing surface for the lens the intermediate holding member 25.

And they are adjusted along the $\alpha$, $\beta$ and $\gamma$ directions in the similar manner. Further, because the optical element has a spherical shape having the optical axis as its center when in a case the optical element is lens, a discrepancy in the optical axis which is caused by an accidental error happened in the manufacturing process cannot be adjusted by a rotation around the optical axis ($\gamma$ axis) and it is merely rotated. In this context the adjustment around the $\gamma$ axis is not required.

Figure 14:
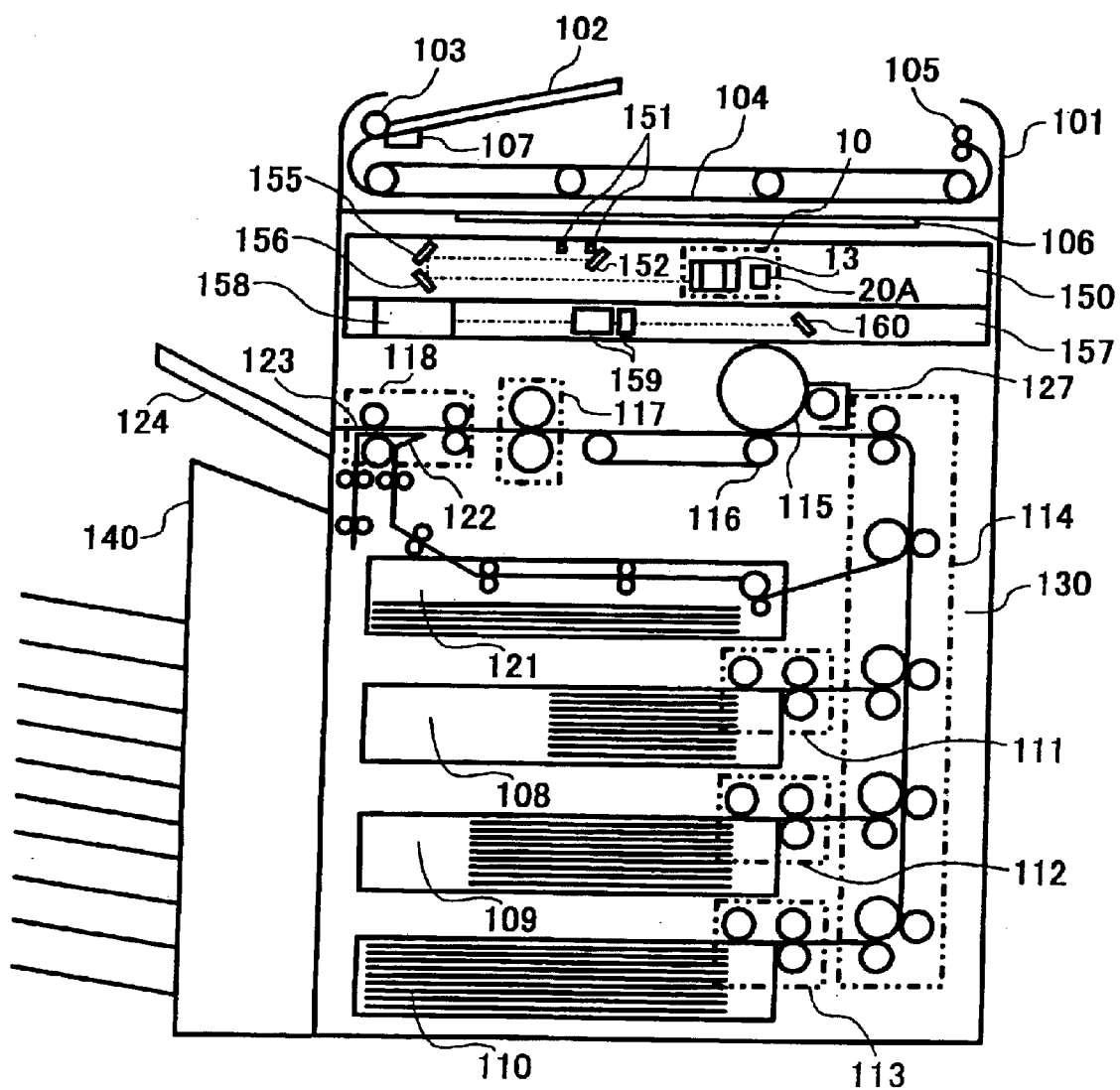
FIG. 14 is a schematic perspective view to show a multi function type digital image forming apparatus as one example of the image scanning apparatus composed of an image scanning unit utilizing a solid state image forming device as a semiconductor device according to the present invention.

As shown in FIG. 14 this image data input apparatus is composed of including automatic document supplier 101, image scanning unit 150, image data writing unit 157, paper supplying unit 130 and post-processing unit 140.

The automatic document supplier 101 supplies automatically a document onto a contacting glass 106 of the image scanning unit 150, and discharges automatically the document which has been read over.

The image scanning unit 150 illuminates the document set on the contacting glass 106 and read the optical information by solid state image forming device 20A which is photoelectric transforming device, the image data writing unit 157 forms an image data on a photosensitizer 115 corresponding to the image data signal which is input from the document read, and transfers it and fixes onto a paper supplied by the paper supplying unit 130. The transferred paper which has been completed all the process is discharged to the post-processing unit 140, and required post-process is achieved such as sorting or stapling.

The image scanning unit 150 comprises the contacting glass 106 and the optical scanning system, which includes an exposing lamp 151, a first mirror 152, lens 13, solid state image forming device 20A, a second mirror 155 and a third mirror 156. The exposing lamp 151 and the first mirror 152 are fixed on a first carriage which is not shown in the drawing, the second mirror 155 and the third mirror 156 are fixed on a second carriage which is also not shown in the drawing.

The first and second carriages are moved mechanically to scan with relative velocity in a ratio of two to one (2:1) in order not to change a length of the light path. The optical scanning system is driven by a scanner driving motor which is not shown in the drawing.

The image data on the document to he copied is read by the solid state image forming device 20A, and optical signal of the image data are transformed into electrical signal in order to be processed. When the lens 13 and the CCD solid state image forming device are moved in the left and right direction of the drawing, the magnification rate of the image can be altered. That is to say, the position of the lens 13 and the CCD solid state image forming device in the left and right direction is set in accordance with the predetermined magnification rate.

The writing unit 157 is composed of laser output unit 158, image focusing lens 159 and a mirror 160, a set of laser diodes which are light sources of laser, and polygon mirror which is driven to rote in high and constant velocity by a motor, are set up in the laser output unit 158.

The laser light beam irradiated from the laser output unit 158 is reflected and changed its direction by the above described polygon mirror which is rotated in constant velocity, passes through the image focusing lens 159, and it is reflected by the mirror 160 to be focused on surface of the photosensitizer. The reflected laser light beam is scanned for exposure in, what is called, main scanning direction which is perpendicular to a rotating direction of the photosensitizer 115, the image data signal are output in an unit of every line from a MSU 606 of the image processing unit. By a repetition of the main scanning in a predetermined period which corresponds to a recording density and rotating velocity of the photosensitizer, an image is formed on the photosensitizer as an electrostatic latent image.

As above described, the laser light beam output from the writing unit 157 is irradiated onto the photosensitizer 115 of an image forming system, a beam sensor which generates a synchronizing signal and is not shown in the drawing, is disposed at irradiated area by one side of the photosensitizer 115. The signal which is output from this beam sensor is a main scanning synchronizing signal and controlling of recording timing for image data and generation of controlling signal for input/output of the image data signal are achieved based on this main scanning synchronizing signal.

The present invention should not be understood that it is limited only to the above described example of embodiment. It can be brought to an implementation in various different manners without departing from spirit of the invention.

As above described, In accordance with the present invention the following effects can be attained.

The adhesive material is made not to contact with the functional surface of the semiconductor, thereby the problem that the adhesive material becomes an invisible electrical circuit and the semiconductor device can not perform its desired function because it works as a capacitor with a harmful parasitic capacitance, or the problem that the adhesive materials happens to inundate to the accepting surface (or the light emitting surface) of the device and block off the light path when the semiconductor chip is utilized as the optical device, are solved.

The semiconductor chip can give effectively the heat generated in the semiconductor chip away to environment because the adhesive material does not cover an opposite surface of the semiconductor functional surface.

At the same time the adhesive material is prevented to flow out and thereby the adhesive material is prevented to enter into the space between the surfaces and the substrate by the flowing out of the adhesive material. Also because the initial form of adhesive material can be kept in and thereby the arrangement of adhesive material can be easily performed.

Further the adhesive material has enough strength against internal and external pressure even before it is hardened. Also the production is easily performed.

The adhesive strength can be made higher because an adhering area between the adhesive material and the semiconductor chip and the substrate can be took wider.

The adhesive material would not wraparound between the functional surface of semiconductor and the substrate because the flowing out of adhesive material can be prevented effectively even when the adhesive material with low viscosity is utilized. The adhesive material with low viscosity can be used as the adhesive material.

The adhesive material in the supporting body can be operated with a negative pressure to support the adhesive material in the body.

The adhesive material holding member can hold the adhesive material by means of the aggregated body of fibers.

The photo curing type adhesive material can be used because whole surface of the held adhesive material is irradiated by a hardening light through the adhesive material supporting body.

The problem would not occur that performance of the device can not be carried out because the adhesive material is not disposed on a light incident area and the light path of the incident light to (or outgoing light from) the semiconductor device would not block off by the adhesive material.

The semiconductor chip and the substrate can be adhered to fix without any discrepancy of holding position due to thermal expansion because a rise in temperature would not almost occur when the adhesive material is cured by a light. Also it does never happen a residual stress influenced by a temperature change in the adhering process.

The adhesive material can be cared by a heat by means of utilizing a heat curing type adhesive material even where the portion can not be irradiated by a light. Because the curing temperature for the heat curing type adhesive material is selected at a predetermined temperature that is lower than a temperature that breaks the conjunction of electrode 6 such as solder or golden bump and so on which electrically connects the semiconductor chip with the wiring portion of the substrate, the substrate and the semiconductor chip can be connected and fixed with maintaining a reliability of the electrical conjunction without occurrence of breakage of the conjunction.

The problem would not occur that performance of the device can not be carried out because the adhesive material is not disposed on a light incident area and the light path of the incident light to (or outgoing light from) the semiconductor device would not block off by the adhesive material.

The adhesive material is made not to contact with the functional surface of the semiconductor, thereby the problem that the adhesive material becomes an invisible electrical circuit and the semiconductor device can not perform its desired function because it works as a capacitor with a harmful parasitic capacitance, or the problem that the adhesive materials happens to inundate to the accepting surface (or the light emitting surface) of the device and block off the light path when the semiconductor chip is utilized as the optical device, are solved. The semiconductor chip can give effectively the heat generated in the semiconductor chip away to environment because the adhesive material does not cover an opposite surface of the semiconductor functional surface.

The adhesive material is prevented to flow out and thereby the adhesive material is prevented to enter into the space between the surfaces and the substrate by the flowing out of the adhesive material. Also because the initial form of adhesive material can be kept in and thereby the arrangement of adhesive material can be easily performed.

The adhesive material has enough strength against internal and external pressure even before it is hardened. Also the production is easily performed.

The adhesive material has enough strength against internal and external pressure even before it is hardened. Also the production is easily performed.

Because the flowing out of adhesive material can be prevented effectively even when the adhesive material with low viscosity is utilized. According to this fact the adhesive material with low viscosity can be used as the adhesive material.

The adhesive material in the supporting body can be operated with a negative pressure and by this negative pressure the adhesive material can be supported in the body.

The adhesive material holding member can hold the adhesive material by means of the aggregated body of fibers.

The photo curing type adhesive material can be used because whole surface of the held adhesive material is irradiated by a hardening light through the adhesive material supporting body.

The problem would not occur that performance of the device can not be carried out because the adhesive material is not disposed on a light incident area and the light path of the incident light to (or outgoing light from) the semiconductor device would not block off by the adhesive material.

The semiconductor chip and the substrate can be adhered to fix without any discrepancy of holding position due to thermal expansion because a rise in temperature would not almost occur when the adhesive material is cured by a light. Also it does never happen that a residual stress influenced by a temperature change in the adhering process.

The adhesive material can be cured by a heat by means of utilizing a heat curing type adhesive material even where the portion can not be irradiated by a light. Because the curing temperature for the heat curing type adhesive material is selected at a predetermined temperature that is lower than a temperature that breaks the conjunction of electrode 6 such as solder or golden bump and so on which electrically connects the semiconductor chip with the wiring portion of the substrate, the substrate and the semiconductor chip can be connected and fixed with maintaining a reliability of the electrical conjunction without occurrence of breakage of the conjunction.

The problem would not occur that performance of the device can not be carried out because the adhesive material is not disposed on a light incident area and the light path of the incident light to (or outgoing light from) the semiconductor device would not block off by the adhesive material.

The heat radiating means would not regulate against the expansion and the contraction by heat and thereby the expansion and the contraction of the heat radiating means does not effect on the semiconductor chip. By this arrangement the semiconductor chip and the substrate are made to be free from the thermal stress other than caused by themselves, and thereby they are free from deformation by an external force.

The heat radiating means can have the elasticity along an expansion and a contraction direction of the semiconductor chip even when the heat radiating means are made of a hard material.

To the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device.

To the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device.

To the expansion or the contraction of the semiconductor chip which is caused by heat, the heat radiating means would not regulate to the expansion and the contraction along the direction of the expansion and the contraction because the heat radiating means is made to have a smaller contacting area space contacting with the semiconductor device.

Further the heat radiating means would not give an influence the stress to the semiconductor chip caused by a deformation of itself.

The problem would not occur that performance of the device can not be carried out because the adhesive material is not disposed on a light incident area and the light path of the incident light to (or outgoing light from) the semiconductor device, it would not block off by the adhesive material.

Because the incident light to the solid state image forming device is not blocked off and the performance of solid state image forming device can be carried out sufficiently, there is no possibility of occurrence of error in reading the image data and thereby the image scanning unit with high reliability can be provided.

Because the performance of solid state image forming device can be carried out sufficiently, there is no possibility of occurrence of error in reading the image data and because the image forming apparatus includes the image forming unit which can carry out the image forming with high reliability, the apparatus can form electrostatic latent image with high accuracy thereby there is no possibility of occurrence of error in reading the image of the manuscript.

What is claimed is:

1. A semiconductor device, comprising:
   a substrate which has a wiring portion;
   a semiconductor chip which has a functional surface in a front surface thereof and which is bonded by flip chip bonding onto an opposing surface of said substrate with a space being formed between the front surface and the opposing surface; and
   an adhesive material configured to be held by a holder, with the adhesive material and holder being configured so as to fix said semiconductor chip and said substrate together by adhering with at least one surface other than said front surface of the semiconductor chip and with the opposing surface of the substrate without any of the adhesive material entering into the space.

2. The semiconductor device according to claim 1, wherein said holder is made of a sponge like material.

3. The semiconductor device according to claim 1, wherein said holder is made of an aggregated body of fibers.

4. The semiconductor device according to claim 2 or 3, wherein said holder has a light transparent property.

5. A semiconductor device, comprising:
   a substrate which has a wiring portion in a front surface thereof;
   a semiconductor chip which has a functional surface facing said front surface and which is bonded by flip chip bonding onto said substrate so as to form a space between the functional surface and the front surface; and
   an adhesive material configured to be held by a holder, with the adhesive material and holder being configured so as to fix said semiconductor chip and said substrate together by adhering with at least one surface other than said functional surface and with the front surface without any of the adhesive material entering into the space, wherein
   a heat radiator is disposed on a back surface of said semiconductor chip opposed to the functional surface.

6. The semiconductor device according to claim 5, wherein said holder is made of a sponge like material.

7. The semiconductor device according to claim 5, wherein said holder is made of an aggregated body of fibers.

8. The semiconductor device according to claim 6 or 7, wherein said holder has a light transparent property.

* * * * *